US009461031B1

(12) United States Patent
Bobde

(10) Patent No.: US 9,461,031 B1
(45) Date of Patent: Oct. 4, 2016

(54) LATCH-UP FREE VERTICAL TVS DIODE ARRAY STRUCTURE USING TRENCH ISOLATION

(71) Applicant: Madhur Bobde, San Jose, CA (US)

(72) Inventor: Madhur Bobde, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/939,900

(22) Filed: Nov. 12, 2015

Related U.S. Application Data

(60) Division of application No. 13/913,384, filed on Jun. 8, 2013, now Pat. No. 9,202,938, which is a continuation of application No. 13/421,608, filed on Mar. 15, 2012, now Pat. No. 8,461,644, which is a division of application No. 12/931,434, filed on Feb. 1, 2011, now abandoned, which is a division of application No. 11/606,602, filed on Nov. 30, 2006, now Pat. No. 7,880,223.

(51) Int. Cl.
*H01L 29/66* (2006.01)
*H01L 27/02* (2006.01)
*H01L 29/74* (2006.01)
*H01L 29/866* (2006.01)

(52) U.S. Cl.
CPC ....... *H01L 27/0255* (2013.01); *H01L 29/7416* (2013.01); *H01L 29/866* (2013.01)

(58) Field of Classification Search
USPC .......................................................... 257/168
See application file for complete search history.

(56) References Cited

U.S. PATENT DOCUMENTS

| | | | |
|---|---|---|---|
| 6,338,986 B1* | 1/2002 | Kawazoe | H01L 27/0248 257/173 |
| 8,461,644 B2* | 6/2013 | Bobde | H01L 29/407 257/328 |
| 9,202,938 B2* | 12/2015 | Bobde | H01L 29/866 |
| 2004/0085691 A1* | 5/2004 | Ker | H01L 29/735 361/56 |

* cited by examiner

*Primary Examiner* — Thao P Le
(74) *Attorney, Agent, or Firm* — Bo-In Lin

(57) ABSTRACT

A method for manufacturing a transient voltage suppressing (TVS) array substantially following a manufacturing process for manufacturing a vertical semiconductor power device. The method includes a step of opening a plurality of isolation trenches in an epitaxial layer of a first conductivity type in a semiconductor substrate followed by applying a body mask for doping a body region having a second conductivity type between two of the isolation trenches. The method further includes a step of applying an source mask for implanting a plurality of doped regions of the first conductivity type constituting a plurality of diodes wherein the isolation trenches isolating and preventing parasitic PNP or NPN transistor due to a latch-up between the doped regions of different conductivity types.

4 Claims, 6 Drawing Sheets

LATCH-UP FREE VERTICAL TVS DIODE ARRAY STRUCTURE USING TRENCH ISOLATION

This patent application is a Divisional Application and claims the Priority Date Jun. 8, 2013 of a co-pending application Ser. No. 13/913,384. application Ser. No. 13/913,384 is a Continuous Application and claims the Priority Date of a co-pending application Ser. No. 13/421,608, now issued into U.S. Pat. No. 8,461,644, filed by common Inventors of this Application on Mar. 15, 2012. application Ser. No. 13/421,608 is a Divisional Application and claims the Priority Date of another application Ser. No. 12/931,434 filed on Feb. 1, 2011 and another application Ser. No. 11/606,602, now issued as U.S. Pat. No. 7,880,273, filed on Nov. 30, 2006 by common Inventors of this Application. The Disclosures made in the patent application Ser. Nos. 13/913,384, 13/421,608, 11/606,602 and 12/931,434 are hereby incorporated by reference.

BACKGROUND OF THE INVENTION

1. Field of the Invention

The invention relates generally to a circuit configuration and method of manufacturing a transient voltage suppressor (TVS). More particularly, this invention relates to an improved circuit configuration and method of manufacturing vertical TVS array implemented with trench isolation for resolving a technical difficulty of latch-up

2. Description of the Relevant Art

The conventional technologies for designing and manufacturing a transient voltage suppressor (TVS) array is still confronted with a technical difficulty that the in a TVS array wherein multiple PN junctions diodes are manufactured in a semiconductor substrate by applying a standard COMS processing steps, there are inherent PNP and NPN parasitic transistors. In an ESD event or the occurrence of a transient voltage, with a larger voltage applied to this TVS array, the parasitic NPN or PNP transistors are turned on and latched up, thus causing a sudden and strong voltage snap back. The sudden and large snapback may cause the undesirable effects of system instability or even damages. Additionally, the latch-up of the parasitic NPN or PNP transistors in the TVS array may further lead to other unexpected or undesirable voltage-current transient conditions. The technical difficulties caused by the parasitic PNP or NPN latch-up in the TVS array cannot be easily resolved.

Specifically, the transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated' circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIGS. 1A and 1B show a circuit diagram and a current-voltage diagram respectively of a TVS device. An idea TVS is to totally block the current, i.e., zero current, when the input voltage Vin is less than the breakdown voltage Vb for minimizing the leakage current. And, ideally, the TVS has close to zero resistance under the circumstance when the input voltage Vin is greater than the breakdown voltage Vb such that the transient voltage can be effectively clamped. A TVS can be implemented with the PN junction device that has a breakdown voltage to allow current conduction when a transient input voltage exceeds the breakdown voltage to achieve the transient voltage protection. However, the PN junction type of TVS has no minority carriers and has a poor clamping performance due to its high resistance as that shown in FIG. 1B. There are alternate TVS implementations with Bipolar NPN/PNP with an avalanche-triggered turning-on of the bipolar transistor. The base is flooded with minority carriers and the bipolar TVS can achieve better clamping voltage as the avalanche current is amplified with the bipolar gain.

With the advancement of electronic technologies, there are increasingly more devices and applications that require TVS diode array for ESD protection, particularly for protecting high bandwidth data buses. Referring to FIG. 2A for a circuit diagram of a four channel TVS and FIG. 2B for side cross sectional views of device implementation of the TVS array showing only the core of the array device. The TVS array as shown in FIGS. 2A and 2B includes a plurality of high-side and low-side steering diodes connect in series wherein the high-side steering diodes are connected to Vcc and the low-side steering diodes connected to ground potential. Furthermore, these high-side and low-side steering diodes are connected in parallel to a main Zener diode wherein the steering diodes are much smaller and having lower junction capacitance. Additionally, as shown in FIG. 2C, such implementation further generates another problem of latch-up due to the SCR action induced by parasitic PNP and NPN, transistors. The main Zener diode breakdown triggers the NPN on which further turns on the SCR resulting latch-up. In high temperature, the high leakage current through the NP junction of the parasitic NPN may also man on the SCR leading to latch-up even though the NPN is not turned on. To suppressed latch-up due to the SCR action induced by parasitic PNP and NPN transistors, the actual device implementation on a semiconductor substrate requires a lateral extension on the substrate of a distance that may be up to 100 micrometers or more as shown in FIG. 2B and the suppression usually is not effective enough.

FIGS. 3A and 3B illustrate particular difficulty caused by latch-up through the parasitic PNP transistor in an Ethernet differential protection circuit. In this Ethernet protection circuit, both Vcc and ground pins are floating. However, a parasitic SCR structure is not sufficiently weak in the design that causes a sudden voltage snap back as shown in FIG. 3B. Such sudden and strong snap back may cause undesirable effects of system instability or even damages. The difficulties cannot be easily resolved because the parasitic PNP transistor is inherent in the standard CMOS process and the fact that, both Vcc and ground pin floating deteriorates the effect of latech-up. Additional buried layers are required to suppress the gain of the parasitic PNP transistors that causes complicated device configurations and high manufacturing costs.

Therefore, a need still exists in the fields of circuit design and device manufactures for providing a new and improved circuit configuration and manufacturing method to resolve the above-discussed difficulties. Specifically, a need still exists to provide new and improved TVS circuits that can effectively and conveniently prevent the parasitic PNP/NPN transistor latch-up.

SUMMARY OF THE PRESENT INVENTION

It is therefore an aspect of the present invention to provide a new and improved device structure for a TVS array to implement latch-up isolation trenches to prevent the latch-up of the parasitic PNP-NPN transistors such that the above-discussed difficulties and limitations encountered by the conventional TVS array can be overcome.

Another aspect of the present invention to provide a TVS array that implemented with isolation trenches between diodes such that the lateral distance between adjacent diodes can be reduced without the concerns of latch-up.

Briefly in a preferred embodiment this invention discloses a TVS array that includes a plurality of diodes formed as dopant regions of different conductivity types for constituting PN junctions in a semiconductor substrate. The TVS array further includes an isolation trench between the dopant regions for isolating and preventing latch-up of a parasitic PNP or NPN transistor.

The present invention further discloses a method for manufacturing an electronic device with an integrated transient voltage-suppressing (TVS) array. The method includes a step of manufacturing the TVS array in a semiconductor substrate by doping a plurality of dopant regions of different conductivity types to form diodes between, PN junctions between these dopant regions. The method further includes a step of formicg an isolation trench between the dopant regions for isolating and preventing a latch-up of a parasitic PNP or NPN transistor between the dopant regions of different conductivity types.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
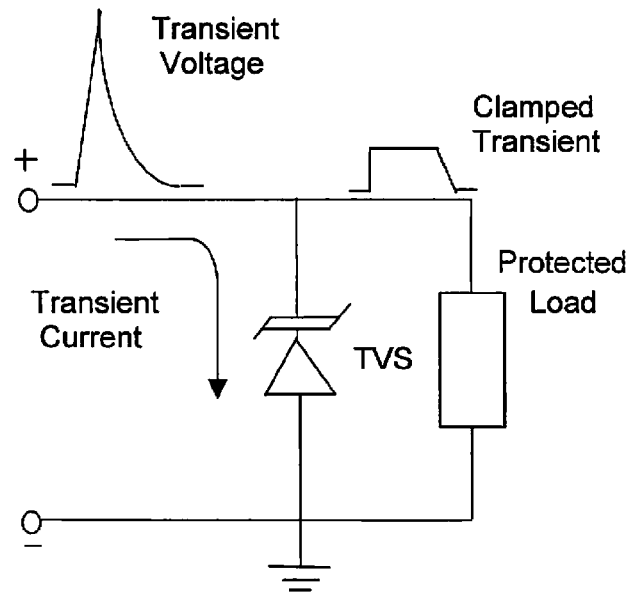
FIG. 1A is a circuit diagram for showing a conventional TVS device and FIG. 1B is an I-V diagram, i.e., a current versus voltage diagram, for illustrating the reverse characteristics of the TVS device.
Figure 1B:
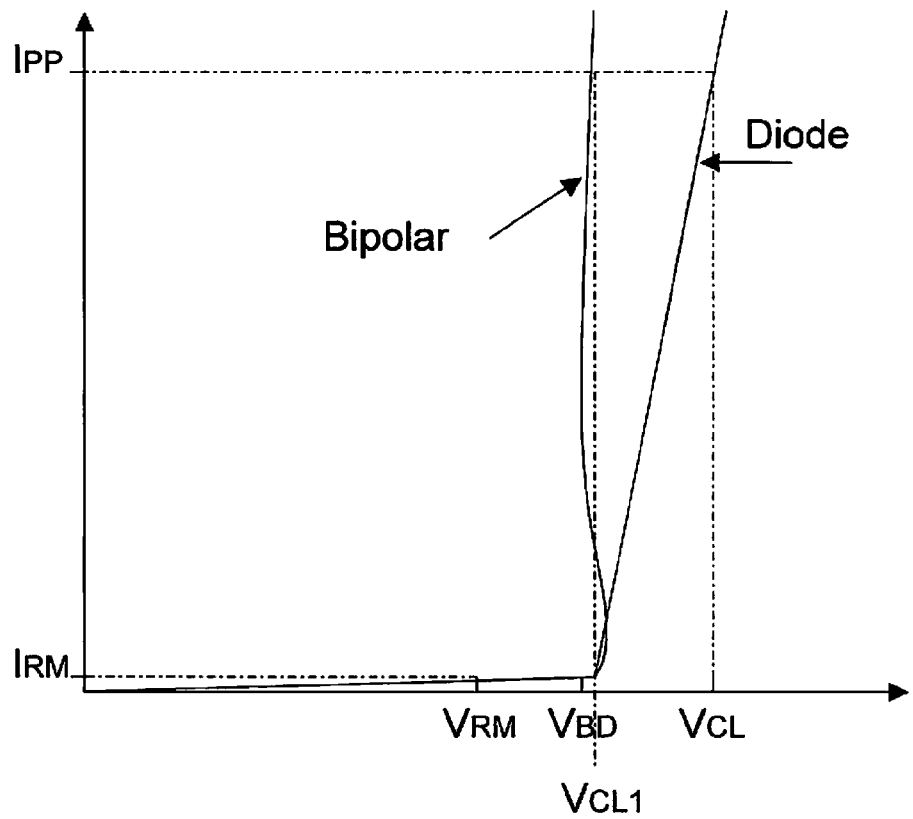
Figure 2A:
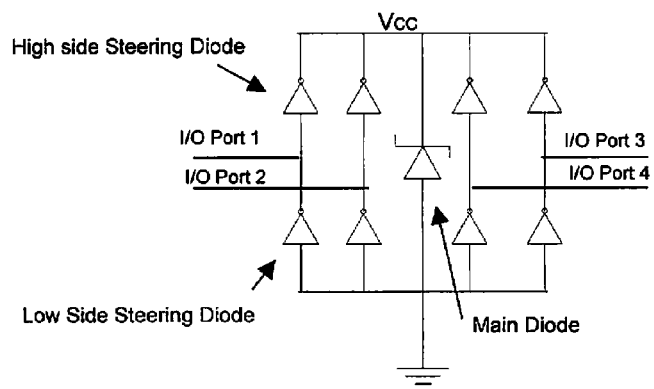
FIG. 2A shows a circuit diagram of a TVS array comprising a plurality of high side and low side diodes connected to a plurality of IO pads with a main Zener diode connected in parallel to the high side and low side diodes.
Figure 2B:
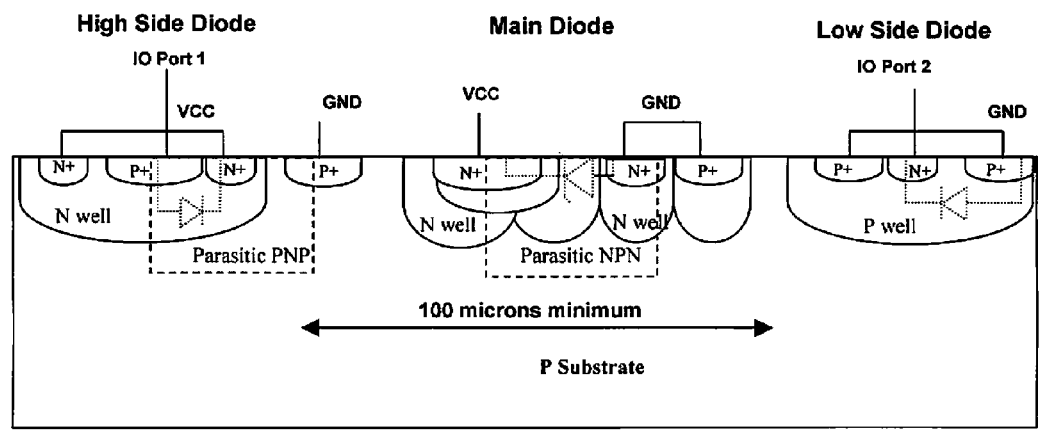
FIG. 2B is a side cross sectional view for illustrating device implementation of the TVS array of FIG. 2A according to a conventional device configuration.
Figure 2C:
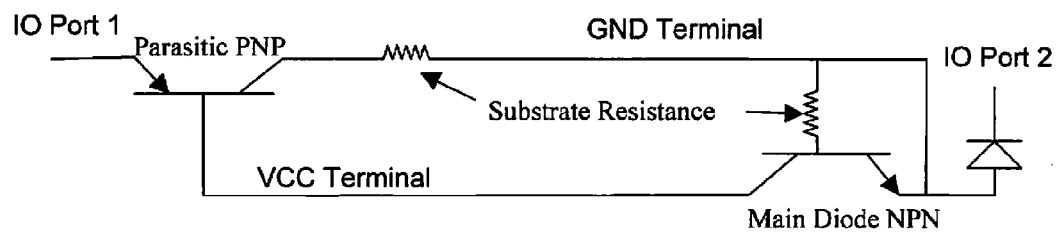
FIG. 2C shows the equivalent circuit diagram for illustrating the potential latch-up of device as implemented in FIG. 2B
Figure 3A:
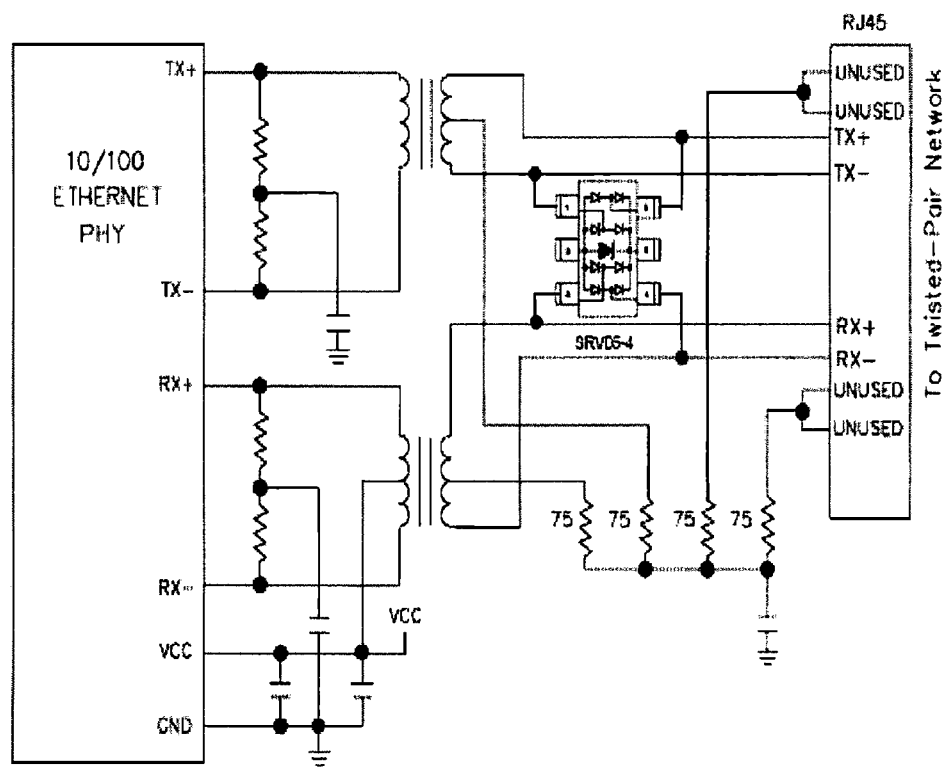
FIG. 3A is a circuit diagram of an Ethernet differential protection circuit that requires both Vcc and GND pins to float and requires buried layers to suppress gain of parasitic SCR with the protection circuit configured according to structures shown in FIG. 2B.
Figure 3B:
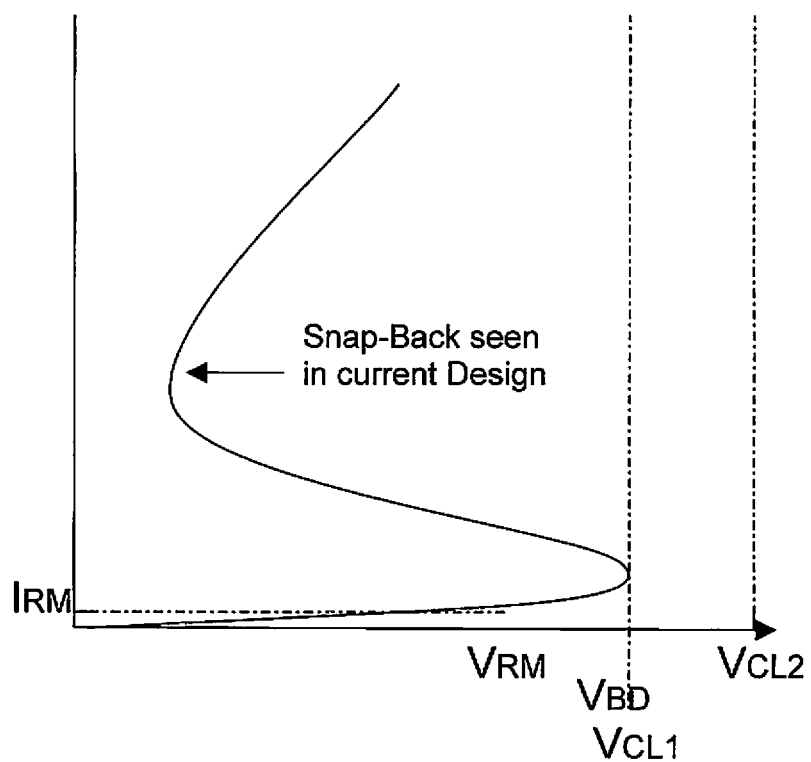
FIG. 3B shows an I-V diagram for illustrating an ESD protection or TVS operation when a conventional TVS array is applied that leads to the occurrence of art undesirable sudden and significant snap back.
Figure 4:
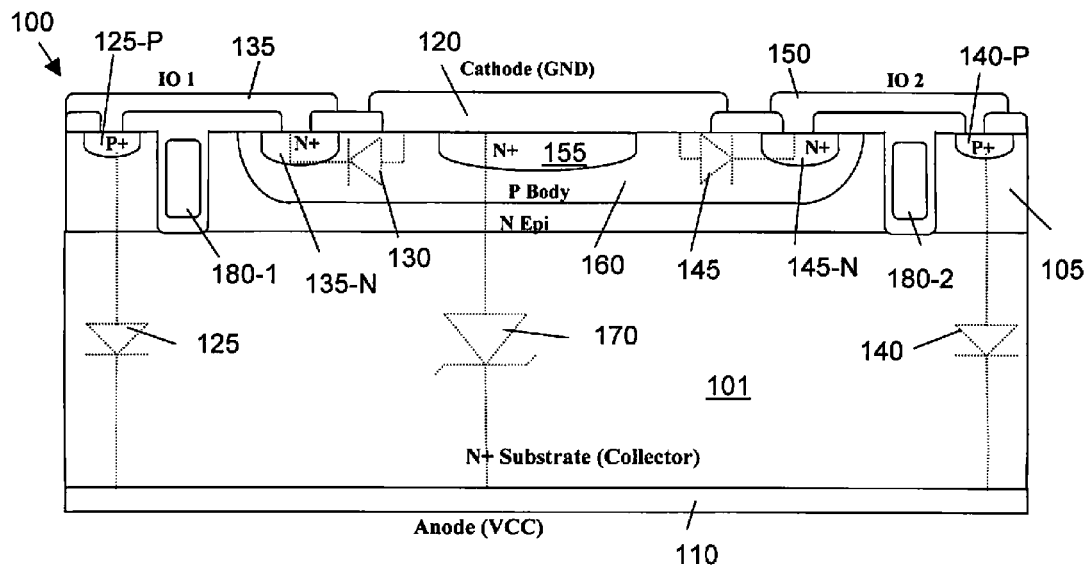
FIG. 4 is a side cross sectional view of a TVS array implemented with isolation trenches of this invention that significantly reduced the latch-up of the parasitic PNP or NPN transistors.

Referring to FIG. 4 for a side cross sectional view of a new and improved implementation a part of TVS array of this invention. The partial TVS array 100 as shown with two channels is supported on a N-epi layer 105 on top of a N+ substrate 101 with the bottom surface connected to an anode terminal 110 at a Vcc voltage. The TVS array is connected between the anode 110 disposed at the bottom surface and a cathode terminal 120 disposed at a top surface connected to a ground voltage. The TVS array 100 further includes a first high side diode 125 and a first low side diode 130 connected to a first IO terminal 135. The TVS array 100 further includes a second high side diode 140 and a second low side diode 145 connected to a second IO terminal 150. The first high side diode 125 is formed as a PN junction between the P+ doped region 125-P and the N-epi 105. The first low side diode 130 is formed as a PN junction between an N+ region 135-N and a P-body region 160 disposed below the cathode terminal 120 with the first IO pad 135 connected to an N+ dopant region 135-N of the first low side diode 130 and to the P+ dopant region 125-P of the first high side diode 125. The second low side diode 145 is formed as a PN junction between the N+ region 145-N and the P-body region 160 disposed below the cathode terminal 120 with the second 10 pad 150 connected to an N+ dopant region 145-N of the second low side diode 145 and to the P+ dopant region 140-P of the second high side diode 140. A Zener diode 170 of a greater area is formed with a PN junction between the P-body 160 and the N-epitaxial layer. An NPN transistor that can be triggered on by Zener diode 170 is formed by N+ emitter region 155, P body region 160 and N+ substrate 101 to conduct large transient current without much resistance. The TVS array 100 further includes a first isolation trench 180-1 formed between the first high side diode 125 and first low side diode 130. The TVS array 100 further includes a second isolation trench 180-2 formed between the second high side diode 140 and second low side diode 145. The isolation trenches prevent the latch-up of the parasitic NPN or PNP transistors that are inherently formed between multiple PN junctions formed by the high side and low side diodes.

Figure 5:
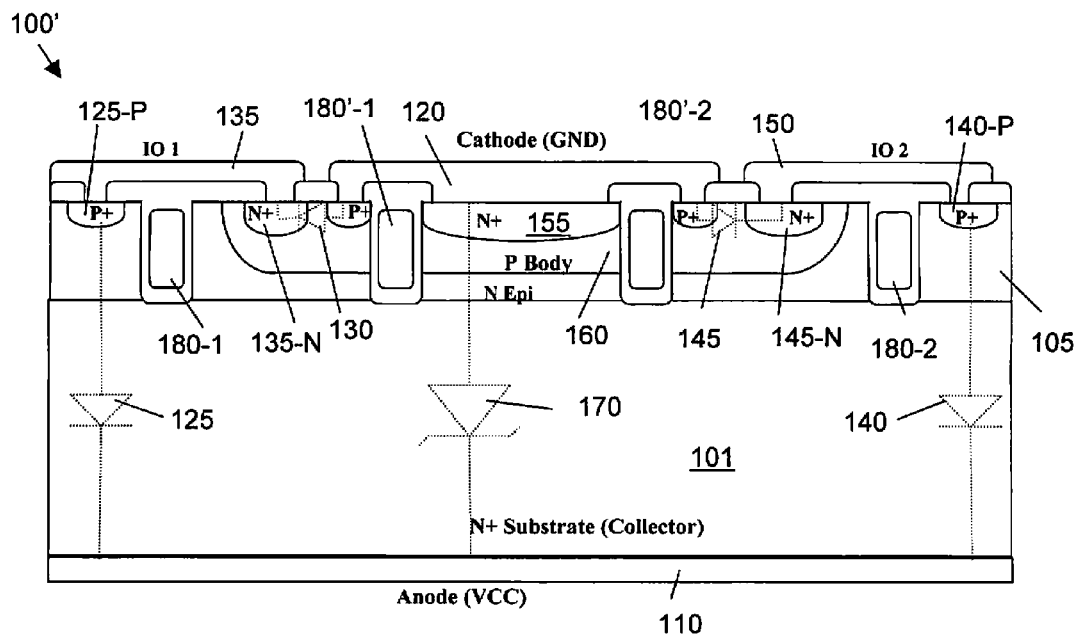
FIG. 5 is a side cross sectional view of another TVS array implemented with isolation trenches of this invention that significantly reduced the latch-up of the parasitic PNP or NPN transistors.

FIG. 5 is a side cross sectional view of new and improved implementation of another TVS array of this invention. The device 100' in FIG. 5 is similar to device 100 in FIG. 4 except that there are extra trenches in device 100' to provide better isolation. Trenches 180'4 and 180'-2 separate the low side diodes from the main Zener diode region therefore break down the lateral NPN configured by N+ region 155, P body 160 and low side diode cathode regions 135-N and 145-N.

Figure 6:
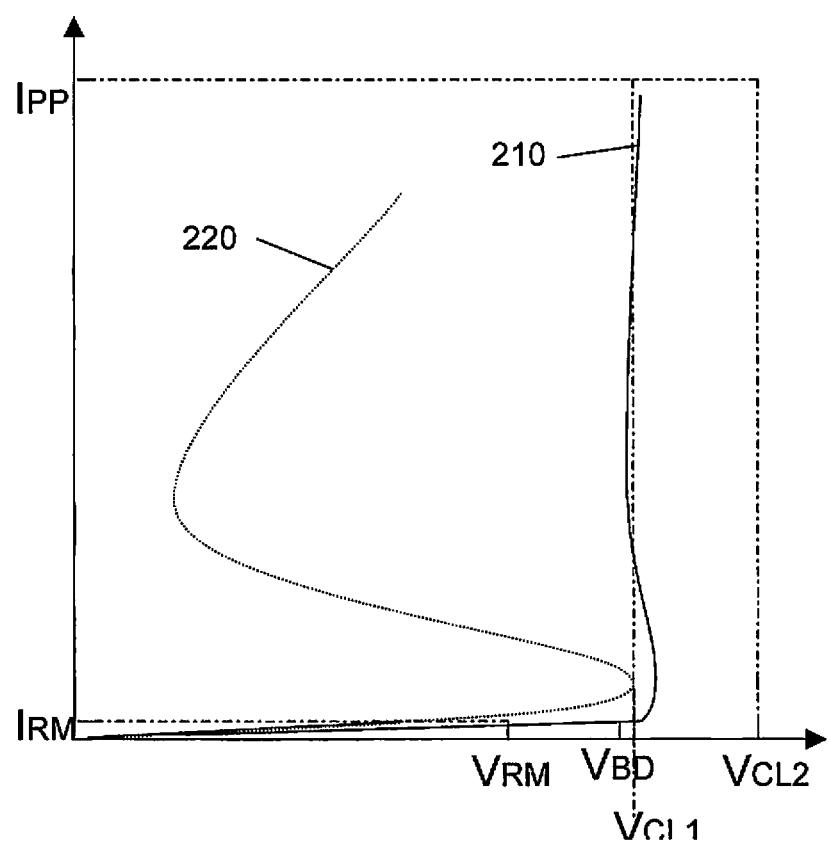
FIG. 6 is an I-V diagram for illustrating an operation of an ESD protection or TVS operation with significantly reduced snap back because the latch-up is eliminated.

FIG. 6 is an I-V diagram for illustrating an operation of an ESD protection or TVS operation with significantly reduced snap back because the latch-up is eliminated. As illustrated in the I-V diagram, the I-V curve 210 shows a sudden snap back due to the latch up of the parasitic NPN or PNP transistors that are likely to turn on with high voltage and current between different doped regions in the substrate in a TVS array. With the isolation trenches 180-1 and 180-2, the latch-up is eliminated and the snap back is greatly reduced. An I-V curve as shown in curve 210 is achieved with unduly causing system instability due to sudden voltage variations when a snap back occurs.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A transient voltage suppressing (TVS) array comprising:
   a plurality of isolation trenches in an epitaxial layer of a first conductivity type in a semiconductor substrate to separate a plurality of semiconductor regions insulated by the isolation trenches and a body region having a second conductivity type in an upper part of said epitaxial layer with the body region extends laterally over an entire length of the semiconductor regions between two of the isolation trenches;
   a plurality of doped regions of said first conductivity type in each of the semiconductor regions including a top doped region of the first conductivity type disposed under a top surface of the substrate encompassed in the body region and extends laterally over substantially an entire length of the first semiconductor region to constitute a bipolar transistor comprising vertically stacked PN junctions disposed between two of the isolation trenches for triggering the bipol transistor by a Zener diode comprising a bottom vertically stacked PN junction between the body region and the epitaxial layer for carrying a transient current for suppressing a transient voltage; and
   a top metal layer in contact with the doped region of the first conductivity type disposed on top of the bipolar transistor constituting a cathode electrode and a bottom metal layer disposed on a bottom surface of the semiconductor substrate constituting an anode electrode.

2. The TVS of claim 1 further comprising:
   a first I/O pad disposed on top of the semiconductor substrate to electrically connect a first high side and a first low side diodes and a second I/O pad by disposed on top of the semiconductor substrate to electrically connect a second high side and a second low side diodes.

3. The TVS array of claim 2 further comprising:
   doped regions of the second conductivity type disposed away from the body region for constituting the first and second high side diodes with said epitaxial layer to connect to said low side diodes encompassed in said body region with the first and second input-output (IO) contact pads across said isolation trenches.

4. The TVS array of claim 1 wherein:
   the plurality of doped regions of the first conductivity type constituting a Zener doped region with a greater width wherein said Zener doped region comprising vertically stacked PN junctions in the first semiconductor region for functioning as a Zener diode with said body region in said epitaxial layer.

* * * * *